United States Patent
McAdoo

(10) Patent No.: US 7,269,359 B1
(45) Date of Patent: Sep. 11, 2007

(54) FOCAL PLANE ARRAY WITH SYNCHRONOUS DETECTION CIRCUITS FOR AN ACTIVE REMOTE SENSING SYSTEM

(75) Inventor: James Alexander McAdoo, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 760 days.

(21) Appl. No.: 10/322,692

(22) Filed: Dec. 18, 2002

(51) Int. Cl.
*H04B 10/06* (2006.01)
(52) U.S. Cl. .......................... 398/205; 398/33; 398/207
(58) Field of Classification Search .................. 398/33, 398/94, 95, 45, 46, 49, 205, 207
See application file for complete search history.

(56) References Cited

U.S. PATENT DOCUMENTS

| | | | |
|---|---|---|---|
| 4,800,288 A * | 1/1989 | Inagaki et al. | 348/300 |
| 5,225,696 A * | 7/1993 | Bahraman | 257/291 |
| 5,812,190 A | 9/1998 | Audier et al. | |
| 5,892,540 A * | 4/1999 | Kozlowski et al. | 348/300 |
| 5,965,871 A | 10/1999 | Zhou et al. | |
| 6,133,989 A | 10/2000 | Stettner et al. | |
| 6,376,871 B1 * | 4/2002 | Arai | 257/290 |
| 6,683,645 B1 * | 1/2004 | Collins et al. | 348/294 |
| 6,700,858 B2 * | 3/2004 | Lee et al. | 369/124.02 |

* cited by examiner

Primary Examiner—Dzung Tran
(74) Attorney, Agent, or Firm—RatnerPrestia

(57) ABSTRACT

The invention provides a synchronous detector for a unit cell of a read out integrated circuit (ROIC). The synchronous detector includes a bipolar photo-detector formed in a focal plane array (FPA) for sensing light energy. The bipolar photo-detector has one end coupled to a sense node of the unit cell, and another end coupled to a reference generator for biasing the bipolar photo-detector. The bipolar photo-detector is biased by the reference generator, resulting in the light energy sensed by the bipolar photo-detector to be provided to the sense node as a synchronously detected signal. A capacitor is coupled to the sense node for low pass filtering the synchronously detected signal. The reference generator provides alternating positive and negative voltage levels, where the positive voltage level forward biases the bipolar photo-detector and the negative voltage level reverse biases the bipolar photo-detector. The bipolar photo-detector provides alternating positive and negative current levels to the sense node, in response to the modulated laser light signal, and provides synchronous detection of the light energy sensed by each photo-detector.

13 Claims, 9 Drawing Sheets

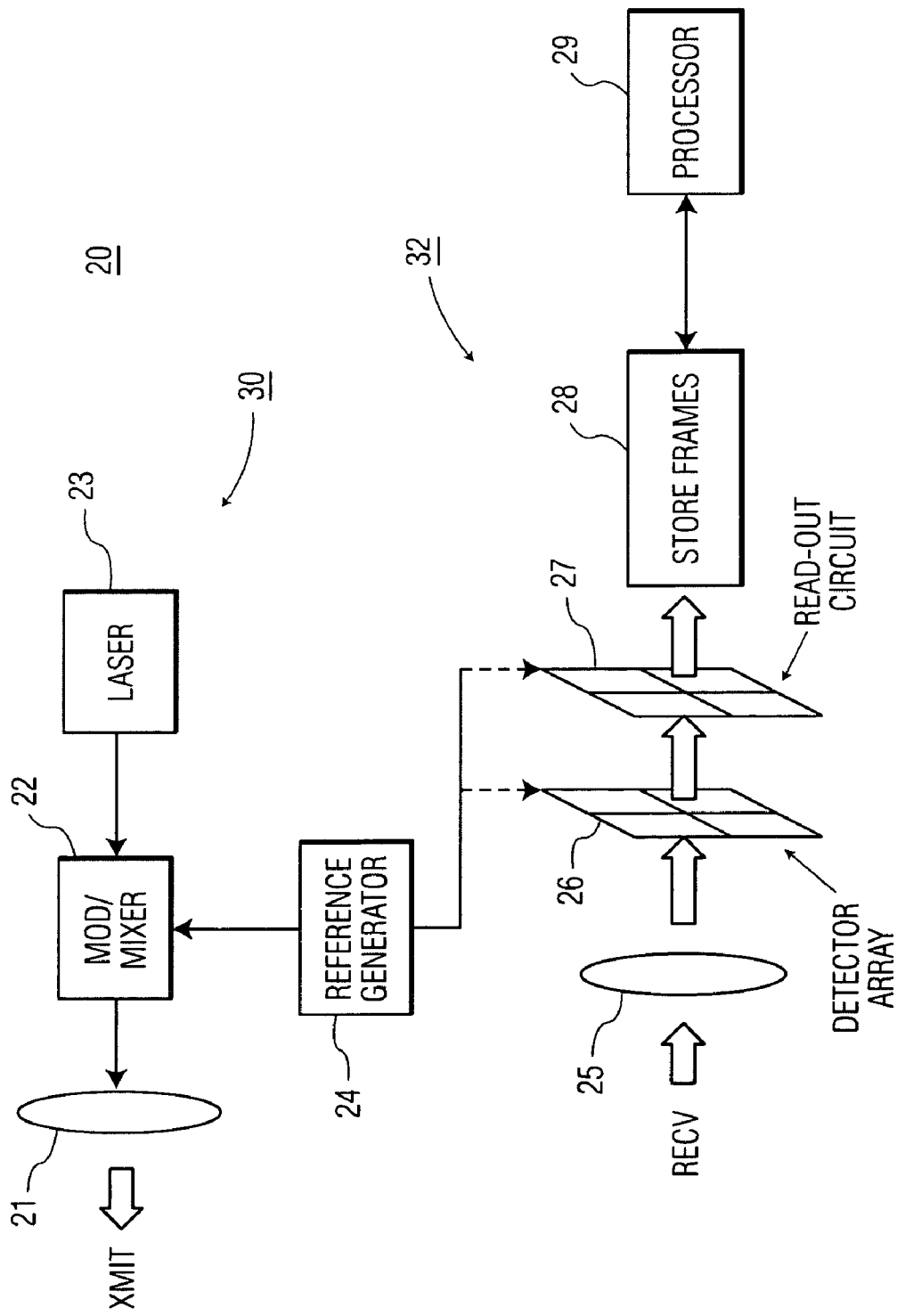

FOCAL PLANE ARRAY WITH SYNCHRONOUS DETECTION CIRCUITS FOR AN ACTIVE REMOTE SENSING SYSTEM

FIELD OF THE INVENTION

This invention relates, in general, to active remote sensing systems and, more particularly, to a focal plane array (FPA) with synchronous detection circuits for an active remote sensing system.

BACKGROUND OF THE INVENTION

Synchronous detection is a signal processing method used to extract weak signals from a noisy background. This method may be implemented using conventional lock-in amplifiers.

Synchronous detection requires that the signal of interest be modulated at a very stable frequency and the detector, at a receiving end, have access to the modulation signal (reference signal). The detected signal and the reference signal must also be in phase with each other.

FIG. 1 illustrates a conventional synchronous detection device 10. The signal of interest is modulated by a reference signal at a frequency $\omega_m$ (typically tens of Hz to a few kHz). The signal of interest and the reference signal are both multiplied, or mixed together, and the output signal is fed to a low-pass filter. As shown, the signal of interest, $A_s$, is provided to modulator 12 and then modulated by a reference signal, $\sin(\omega_m t)$, generated by reference source 18. The modulated signal, $A_s \sin(\omega_m t)$, is multiplied with the reference signal in mixer 14 and then low-pass filtered by low-pass filter 16.

Mathematically, the mixing process may be described as multiplication of the signal of interest given by:

$$Y_s(t) = A_s \sin(\omega_m t) \qquad (1)$$

with the reference signal expressed as:

$$Y_{ref}(t) = \sin(\omega_m t) \qquad (2)$$

to yield an output of:

$$Y_{out}(t) = (A_s/2)(1 + \cos(2(\omega_m t))) \qquad (3).$$

Subsequent low-pass filtering rejects the component at twice the modulation frequency and yields the amplitude of the signal of interest $(A_s)$, which is the quantity to be measured.

FIGS. 2A-2C show schematic representation of synchronous detection in the frequency domain. The mixing process has the effect of down-converting the signal of interest from a frequency above the modulation frequency to DC (ignoring the high frequency component). The information of interest, which is the amplitude of the signal, is preserved. Because the output frequency of the mixer is near DC, it may be passed through a filter with a small bandwidth. Narrowing the bandwidth of this filter allows noise to be reduced without reducing the signal. This results in high signal-to-noise ratio (SNR) values, enabling weak signals to be extracted from noisy backgrounds.

Theoretically, lock-in amplifiers assume that the signal amplitude is a DC quantity, thereby allowing the low-pass filter to have a very small cut-off frequency. In actuality, the signal may be quasi-DC in the sense that the amplitude may be slowly varying as a function of time. Accordingly, the low-pass filter cut-off frequency must be large enough to accommodate the rate of variation of the signal amplitude $A_s$ without loss of information, as shown in FIG. 2C. For example, the motion of a platform may cause the information content to vary at a rate typically in excess of a few tens of Hz.

Synchronous detection requires that the signal of interest and the reference signal both be in phase with one another. In a laboratory environment, this may easily be achieved. In a remote sensing environment involving active optical sources, however, the return time of the optical signal varies as a result of changes in the distance between the transmitter and the target. This results in a variable phase between the signal of interest and the reference signal. Limiting this variable phase introduces additional levels of complexity to synchronous detection devices.

Synchronous detection, or lock-in methods are advantageous over other detection methods, because they reduce noise components near the signal of interest. The mixing process shifts the frequency of the signal of interest from the modulation frequency down to DC; it also shifts the noise components near DC that are present at the input of the mixer up to the modulation frequency. These components, however, are rejected in the low-pass filter. The result is a reduction in 1/f noise present in the signal at the input to a synchronous detector.

Another advantage is that synchronous detection only yields information on the modulated portion of the signal provided at the input of the synchronous detector. This is particularly useful for active sensors, because modulating the source (laser) instead of chopping an input to the receiver allows photo-currents associated with interactions of a target and the source to be separated from background noise. Additionally, the method is also superior to simply modulating the source and using a band-pass filter at the modulation frequency to isolate the signal of interest from the background noise. It is generally much more difficult to realize a very narrow filter about a center frequency of tens of Hz to a few kHz than it is to build a filter near DC.

Synchronous detection for a single pixel detector has been developed. Synchronous detection for arrays of pixels in a FPA, however, has not been developed, most likely due to the difficulty in providing an independent synchronous detector for each pixel in the array. A FPA having 256×256 pixels requires 65,536 independent synchronous detectors.

Conventional lock-in amplifiers with synchronous detection have been developed based on digital filtering technology. These are not used in FPAs, however, because of impractical digital processing rates needed to process the data from all the pixels in the FPA. For example, the FPA would need to be operated at a frame readout rate of several times the chopping frequency (modulation frequency), and the data then digitized and processed for each pixel. This would require that the FPA be operated at several thousand frames per second (including digital conversion) and that the processing throughput keep up with this data rate.

While, conceptually, FPAs with large number of taps and analog-to-digital converters (ADCs) of up to one per column may be implemented, this approach has several drawbacks. First, operation at several thousand frames per second for an array with 256 or more pixels per row requires that each tap and ADC operate at several million pixels per second. The high bandwidth required for this would result in a substantial read-out noise penalty. Additionally, the ADC power consumption would be high, if an ADC, with high number of bits (typically 14+) and high readout rates (>1 MSPS), is needed for each column. As a practical matter, there would also be a significant risk of cross-talk and noise associated with capacitive coupling due to the large number of high-speed digital signals present. Finally, real-time digital signal processing needed to implement synchronous detection would be a major challenge in such a high data-rate environment (e.g. 256×256×5,000 FPS=327 million words/sec).

Accordingly, a need exists to provide a FPA with synchronous detection capability. No practical solution has thus far been suggested. This invention addresses this need and discloses several solutions.

SUMMARY OF THE INVENTION

To meet this and other needs, and in view of its purposes, the present invention provides a synchronous detector for a unit cell of a read out integrated circuit (ROIC). The synchronous detector includes a source generator coupled to a pixel of a photo detector array (PDA) for forming positive and negative signal levels from the light energy sensed by the pixel, a reference generator for providing a reference signal, and a switch operatively coupled to the reference generator for sequentially switching the positive and negative signal levels from the source generator onto a sense node of the unit cell. The light energy sensed by the pixel is synchronously detected at the sense node of the unit cell. The synchronous detector further includes a capacitor coupled to the sense node for low pass filtering the positive and negative signal levels sequentially switched onto the sense node.

Another embodiment of the invention includes a bipolar photo-detector formed in a photo detector array (PDA) for sensing light energy, where the bipolar photo-detector has one end coupled to a sense node of a unit cell. A reference generator is coupled to another end of the bipolar photo-detector for biasing the bipolar photo-detector. The bipolar photo-detector is biased by the reference generator and the light energy sensed by the bipolar photo-detector is provided to the sense node as a synchronously detected signal. The synchronous detector further includes a capacitor coupled to the sense node for low pass filtering the synchronously detected signal.

Yet another embodiment of the invention includes a read out integrated circuit (ROIC) for synchronously detecting light energy sensed by each pixel of a photo detector array (PDA). The ROIC includes a plurality of source generators, where a source generator is coupled to each respective pixel of the PDA for forming positive and negative signal levels from light energy sensed by each respective pixel. Also includes is a reference generator for providing a reference signal and a plurality of switches. Each switch is operatively coupled to the reference generator and to each respective source generator for sequentially switching the positive and negative signal levels from each respective source generator onto a sense node corresponding to the respective pixel. The light energy sensed by the respective pixel is synchronously detected at the sense node corresponding to the respective pixel. The ROIC further includes a plurality of capacitors, each capacitor coupled to the sense node corresponding to the respective pixel for low pass filtering the synchronously detected signal.

Still another embodiment of the invention includes a photo detector array (PDA) coupled to a read out integrated circuit (ROIC). The PDA has a plurality of bipolar photo-detectors arranged in an array, each sensing light energy and each having one respective end coupled to a corresponding sense node of a unit cell in the ROIC. A reference generator is coupled to another end of each respective bipolar photo-detector for biasing the respective bipolar photo-detector. The respective bipolar photo-detector is biased by the reference generator and the light energy sensed by the respective bipolar photo-detector is provided to the corresponding sense node as a synchronously detected signal. The PDA further includes a plurality of capacitors, each capacitor coupled to the corresponding sense node in the ROIC for low pass filtering the synchronously detected signal.

Still another embodiment of the invention includes a method of synchronously detecting light energy. The method includes (a) modulating a laser light signal using a modulation signal; (b) transmitting the modulated laser light signal; (c) receiving, in each pixel of a photo detector array (PDA), a return signal based on the transmitted laser light signal; (d) biasing each pixel of the PDA using the modulation signal; and (e) detecting sequentially, in each pixel of the PDA, positive and negative signal levels of the return signal, in response to the biasing. Each pixel used by the method is a bipolar photo-detector, which is forward and reverse biased by the modulation signal.

It is understood that the foregoing general description and the following detailed description are exemplary, but are not restrictive, of the invention.

BRIEF DESCRIPTION OF THE DRAWINGS

The invention is best understood from the following detailed description when read in connection with the accompanying drawing. Included in the drawing are the following figures:

FIG. 3 is a schematic block diagram of an active remote sensing system, in accordance with an embodiment of the invention;

DETAILED DESCRIPTION OF THE INVENTION

Figure 1:
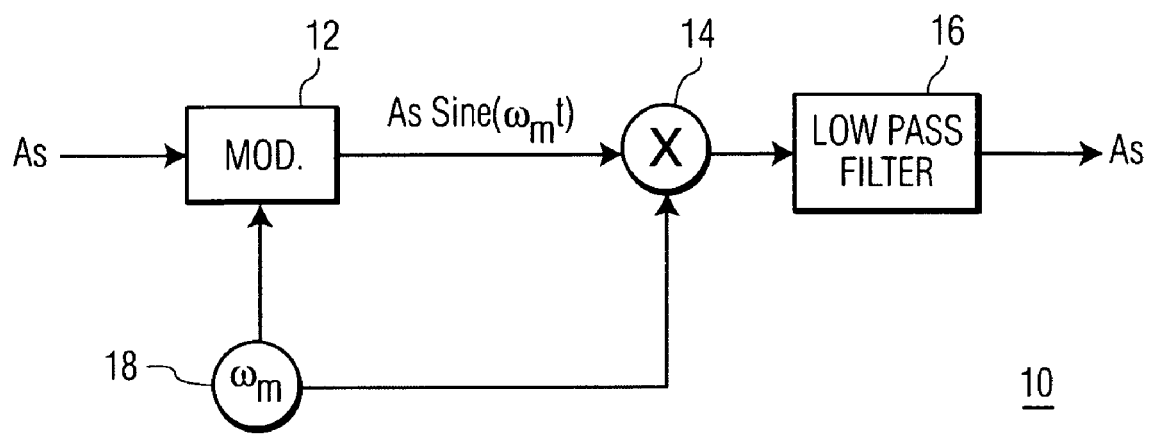
FIG. 1 is a block diagram of a conventional synchronous detection circuit.

As will be described, synchronous detection circuits are independently provided for each pixel of a PDA, in accordance with various embodiments of the invention. The image signal (signal of interest) sensed by each pixel is synchronously detected and provided to a corresponding sense node, accessible by row-column scanning in a read-out integrated circuit (ROIC). Since the signal of interest from each pixel is synchronously detected, frames of an image may be produced using a reasonable processing rate. This results in real-time imaging with savings in read-noise, power and complexity.

Referring first to FIG. 3, there is shown active remote sensing system 20, which includes transmitter 30 and receiver 32. Transmitter 30, as shown, includes laser source 23, modulator/mixer 22 and launch optics 21. Receiver 32, as shown, includes receive optics 25, PDA 26, ROIC 27, frame storage 28 and processor 29.

Reference generator 24 provides a reference signal to modulate the optical signal generated by laser source 23 for transmission toward a target (not shown). Reference generator 24 also provides the reference signal to demodulate a signal return from the target. As will be explained, in one embodiment of the invention, the reference signal is provided to each pixel in PDA 26 for synchronous detection of the signal return (signal of interest). In another embodiment of the invention, the reference signal is provided to each unit cell of a ROIC for synchronous detection of the signal return. Each embodiment is described separately below.

Figure 4:
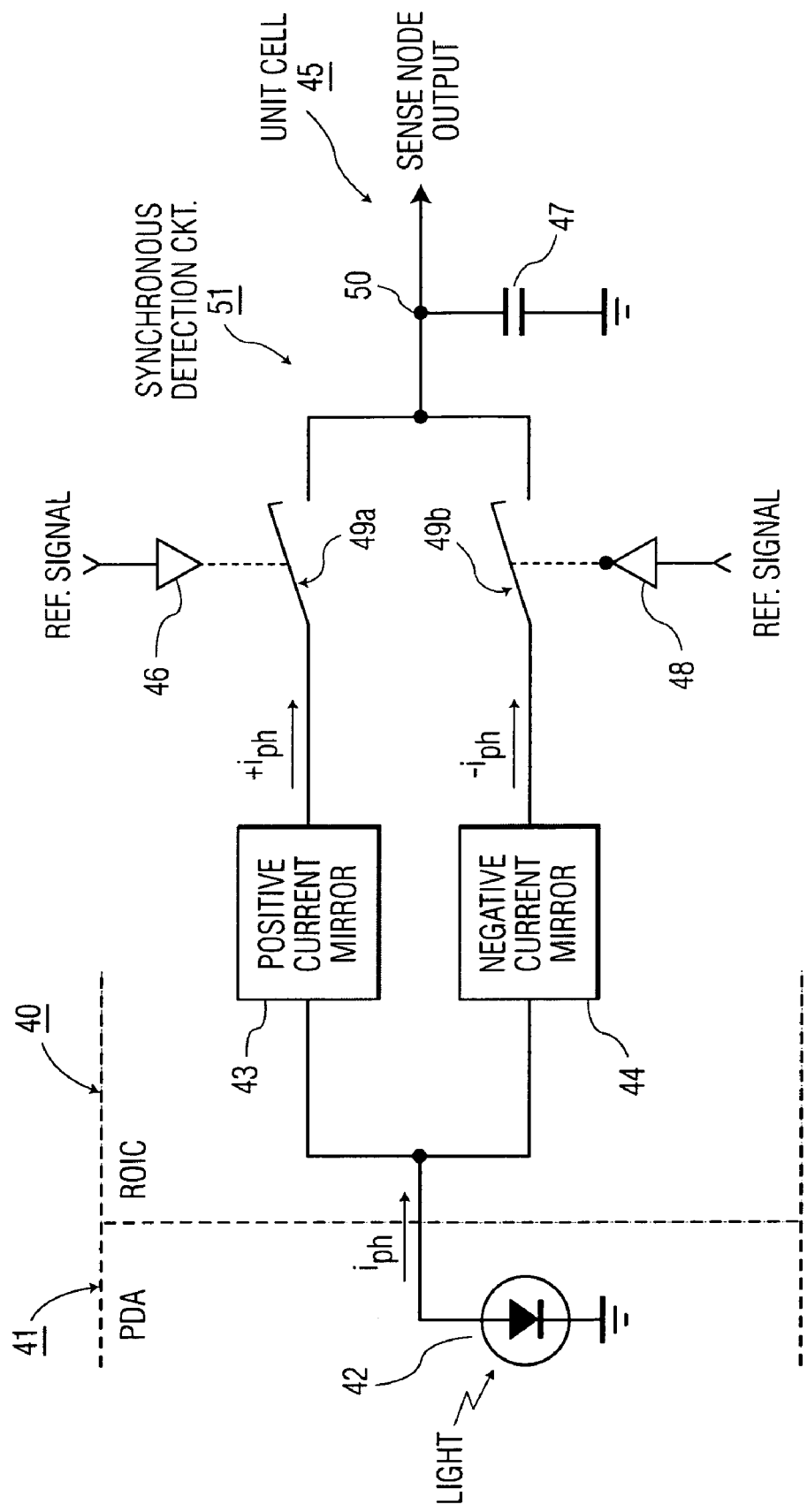
FIG. 4 is a schematic block diagram of a PDA coupled to a ROIC, including a synchronous detection circuit formed in a unit cell of the ROIC, in accordance with an embodiment of the invention.

Referring next to FIG. 4, there is shown ROIC 40 coupled to PDA 41, in accordance with an embodiment of the invention. More specifically, a portion of unit cell 45 is shown connected to pixel 42 of PDA 41. Unit cell 45 includes positive current mirror circuit 43 and negative current mirror circuit 44 connected in parallel with pixel 42. The output lines of mirror circuits 43 and 44 are coupled to sense node 50, by way of respective switches 49a and 49b. Integration capacitor 47 is connected between sense node 50 and a ground potential. Also shown are non-inverter 46 and inverter 48, respectively, providing ON/OFF control to switches 49a and 49b, in response to a binary reference signal (modulation signal), as will be explained below.

It will be appreciated that PDA 41 includes an array of pixels, such as a N×M array of pixels 42, in which N represents a row of pixels and M represents a column of pixels. PDA 41, for example, may be an array of 360×360 pixels, or 129,600 pixels (only one pixel is shown). The PDA in combination with the ROIC are referred to as a focal plane array (FPA).

It will also be appreciated that ROIC 40 includes one unit cell 45 for each corresponding pixel 42 in PDA 41. Accordingly, one set of elements 43, 44, 49a, 49b and 47 is included in each unit cell 45 for each corresponding pixel 42 in PDA 41. One non-inverter 46 and one inverter 48 may also be included in each unit cell 45 for each corresponding pixel 42. As another option, however, one non-inverter 46 and one inverter 48 may be shared amongst one row or several rows of pixels in PDA 41.

In the embodiment shown in FIG. 4, positive current mirror 43, negative current mirror 44, switches 49a and 49b, integration capacitor 47, non-inverter 46 and inverter 48 are collectively referred to herein as synchronous detection circuit 51.

Figure 5A:
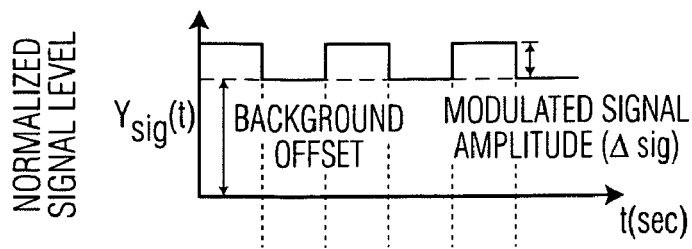
FIGS. 5A-5E are representations of various signal amplitudes versus time for illustrating a synchronous detection process of the circuit of FIG. 4 in the time domain, in accordance with an embodiment of the invention.

In operation, a laser light is modulated (or pulsed) by a reference signal (ON/OFF) and transmitted to a target. A return optical signal impinges on pixel 42 and produces a photo current (iph) that may be proportional to Ysignal(t), as shown in FIG. 5A. Ysignal(t) includes background noise (shown as a background offset component) and the signal of interest (shown as modulated signal amplitude $\Delta$sig).

Figure 5B:
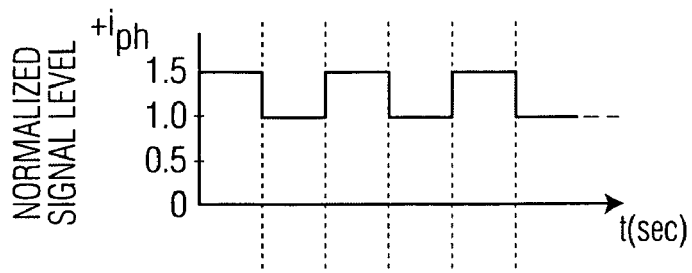
Figure 5C:
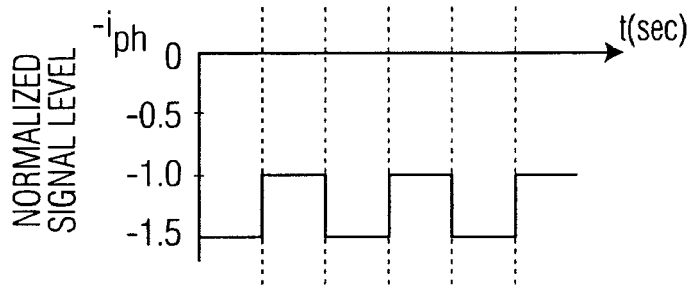

Positive current mirror 43 forms a positive replica of Ysig(t), as shown in FIG. 5B. For discussion purpose, +iph varies, as shown, between 0.5 and 1.5 ampere units (a.u.). Negative current mirror 44 forms a negative replica of Ysig(t), as shown in FIG. 5C. As shown, −iph varies between −1.5 and −1.0 a.u. It will be appreciated that current mirrors 43 and 44 have similar gains but opposite signs.

Figure 5D:
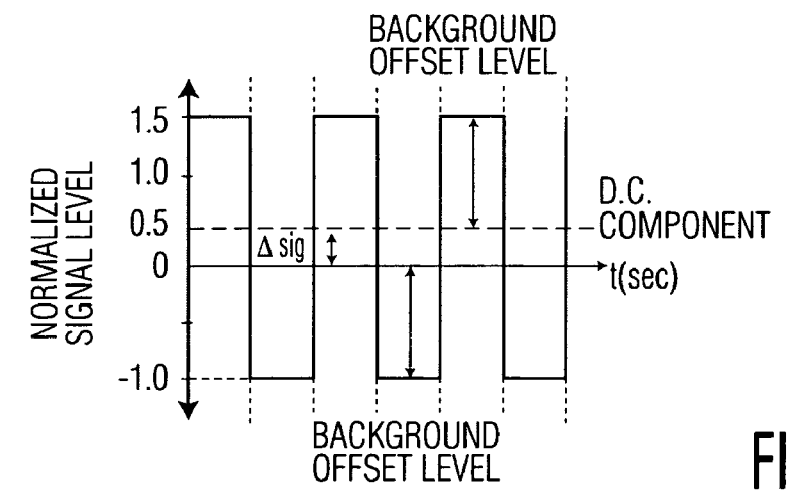
Figure 5E:
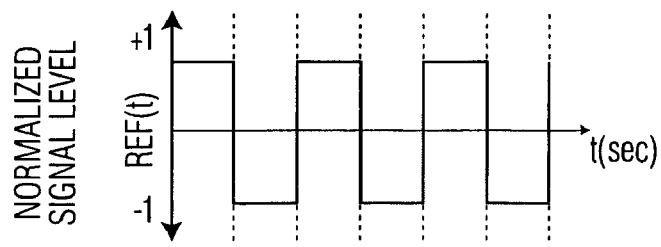

The output of each current mirror is alternately switched to integrating capacitor 47 by switches 49a and 49b. The reference signal modulating the laser light source may be used to control the ON/OFF states of switches 49a and 49b. A reference signal in-phase with the modulation reference signal, as shown in FIG. 5E, may be used. As shown, the reference signal is a square wave centered about a zero signal level. On each half of the square wave, switches 49a and 49b are alternately switched, forming the output signal shown in FIG. 5D, at sense node 50. Accordingly, the output signal at sense node 50 varies between 1.5 a.u. and −1.0 a.u., as shown for example.

It will be observed that this output signal is a square wave having a DC component equal to the peak-to-peak modulation level of the input signal ($\Delta$sig). The DC component is then finally recovered, as a desired output signal, after low pass filtering by integration capacitor 47. The voltage on the integrating capacitor, at the end of a total integration period (N cycles of the reference signal) is directly proportional to the amplitude of the modulated signal ($\Delta$sig) and may be accessed by the ROIC at node 50 (i.e. row-column scan).

Figure 2A:
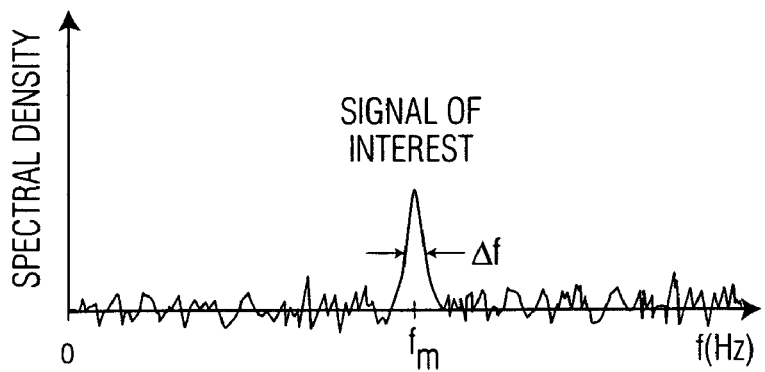
FIGS. 2A-2C are graphs of spectral density versus frequency for illustrating a synchronous detection process in the frequency domain.
Figure 2B:
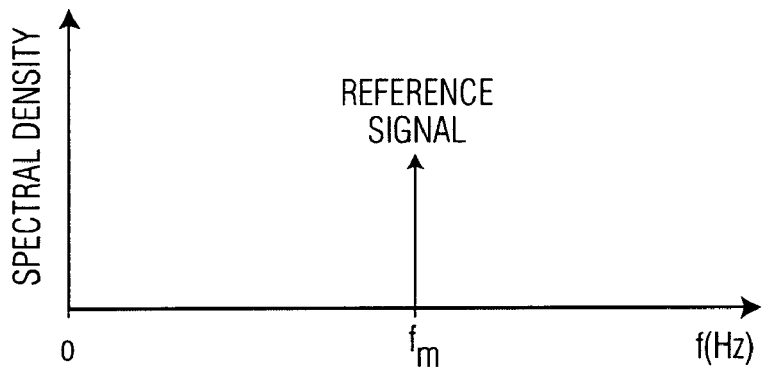
Figure 2C:
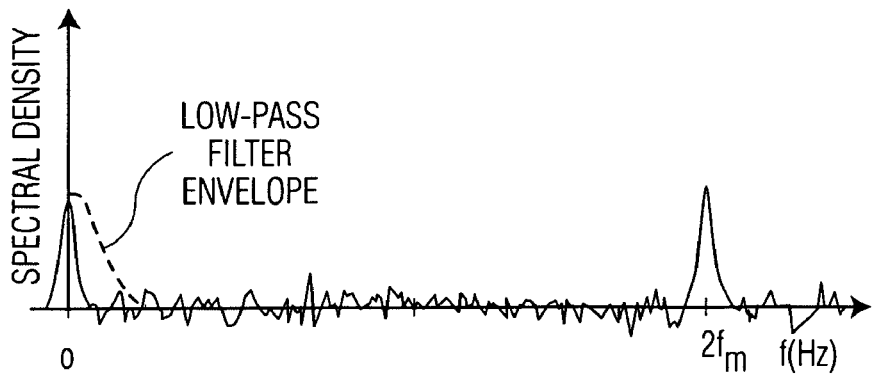

Recalling the discussion on synchronous detection using both a sinusoidal reference signal ($\omega_m$) and a sinusoidal signal of interest, as shown in FIGS. 1 and 2, synchronous detection may also be implemented using square waves for both. Such synchronous detection, shown for example in FIGS. 5A-5E, may result from synchronous detection circuit 51 of FIG. 4. In this example, the signal at the input of the mixer contains a component that is modulated as a square wave superimposed on a DC offset level. The reference signal (FIG. 5E) is a square wave centered around zero; it is important that the square wave be centered about zero, otherwise the mixing process may pass part of the offset of the detector signal. The output of the mixer (at node 50) is also a square wave having a DC component equal to the peak-to-peak modulation of the input signal ($\Delta$sig). This is the signal recovered by the low pass filter as the final measured result.

Discussions of synchronous detection are usually made in the frequency domain, but consideration of the square-wave example of FIG. 5 in the time domain is also useful. Multiplication of the input signal by the reference waveform has the effect of inverting the sign of the input signal during the second half of each cycle of the reference signal. The sum of the output levels during the first and second halves of the cycle is thus the difference between the input signal at these two halve periods. Since the input signal is modulated ON during the first half and OFF during the second half, this value is the amplitude of the modulated component of the signal. The modulated component of the signal is passed to an integrator, or a low pass filter, which averages this difference signal over multiple cycles of the reference signal. In fact, synchronous detection may be thought of as repeatedly taking the difference between the signal-plusbackground-level and the background-level, during each cycle of the reference waveform, and averaging the results over multiple cycles.

A reduction in the effect of 1/f noise may also be understood, as the reduction comes about because the signal is repeatedly sampled to subtract the background-offset-level from the signal-plus-background-offset-level. Because 1/f noise has a long correlation time compared to the inverse of the modulation frequency, this subtraction partially removes the uncertainty associated with 1/f noise effects.

It will be appreciated from this consideration that synchronous detection may be implemented using two elements. The first element multiplies the signal by a positive gain $A^+$ during the first half of the reference cycle and by a negative gain $A^-$ during the second half of the cycle. The second element integrates the signal for a number of cycles, N, such that $\tau_{int} = N \times \tau_m$, where $\tau_{int}$ is the integration time of the output stage and $\tau_m$ is the period of the reference signal $(1/f_m)$. The noise and signal bandwidths are determined by this total integration time. Such an approach carries with it the same benefits of offset rejection (assuming the signal is modulated at the source) and 1/f noise reduction associated with conventional lock-in amplifiers.

Figure 6:
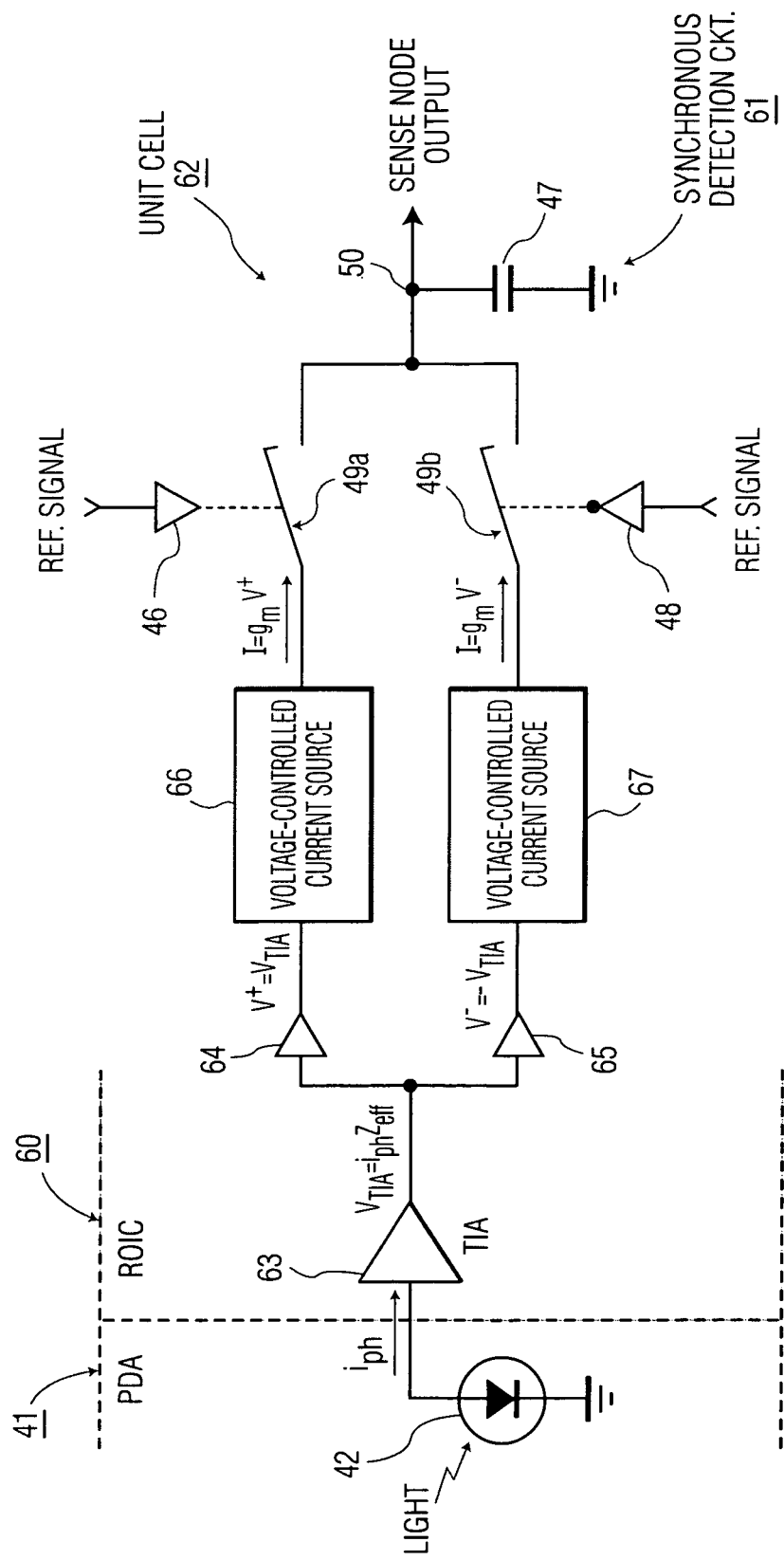
FIG. 6 is a schematic block diagram of a PDA coupled to a ROIC, including a synchronous detection circuit formed in a unit cell of the ROIC, in accordance with another embodiment of the invention.

Referring next to FIG. 6, there is shown synchronous detection circuit 61, in accordance with another embodiment of the invention. As shown, synchronous detection circuit 61 forms a portion of unit cell 62 in ROIC 60. Unit cell 62 provides a voltage read out, at sense node 50, of current flowing from pixel 42 of PDA 41. The PDA and the ROIC are collectively known as the FPA. Synchronous detection circuit 61 provides a function similar to that of synchronous detection circuit 51 of FIG. 4. As discussed previously, this function may be implemented by switching the sign of the signal of interest (iph), from positive to negative, synchronously to the reference signal and then integrating the result.

Synchronous detection circuit 61 includes elements that are similar to elements described in FIG. 4 and are shown labeled with the same reference designations. The signal from pixel 42 is buffered using trans-impedance amplifier (TIA) 63 to produce $V_{TIA}$. Non-inverting operational amplifier 64 forms a positive replica of $V_{TIA}$ ($V^+$) and inverting operational amplifier 65 forms a negative replica of $V_{TIA}$ ($V^-$). Each amplifier has the same gain but opposite signs. Voltage controlled current sources 66 and 67, respectively, form corresponding current sources ($g_m V^+$ and $g_m V^-$). These current sources are functionally similar to current sources +iph and −iph, shown in FIG. 4. The output of each current source is alternately switched to integrating capacitor 47 by the reference signal.

The operation of synchronous detection circuit 61 is similar to the operation of synchronous detection circuit 51, having been described with reference to FIGS. 5A-5E.

It will be appreciated that other embodiments of the invention may be contemplated which use architectures similar to architectures shown in FIGS. 4 and 6. These embodiments may differ in the manner in which the photocurrent is buffered, how the polarities of the sources are switched, etc. These architectures, each forming part of a unit cells, may be implemented with available ROIC design and fabrication techniques.

Fabrication of the synchronous detection circuits of FIGS. 4 and 6 into a ROIC is simpler than fabricating a conventional lock-in amplifier for each pixel with mixers, filters, op-amps, etc. There are, however, some challenges. Embedding synchronous detection circuits 51 or 61 into each unit cell of a ROIC may cause the pixel in a PDA to grow to a larger size than a conventional pixel (40-50 microns).

Another challenge is gain matching. As discussed previously, the positive and negative gains used to provide the synchronous detection circuit must be tightly matched. Any deviation may cause some of the DC offset (i.e. unmodulated signal) to pass through the circuit. Since the background noise may be 100 times larger than the signal of interest, the tolerance is quite tight. Fortunately, this requirement exists only for the positive and negative transfer function elements within a given pixel. The pixel-to-pixel gain variation may be no more stringent or difficult to meet than for any other high-quality PDA. Finally, the effects of switching noise may have to be guarded against, although a relatively low switching frequency (approximately 1 kHz) may reduce the switching noise.

Figure 7:
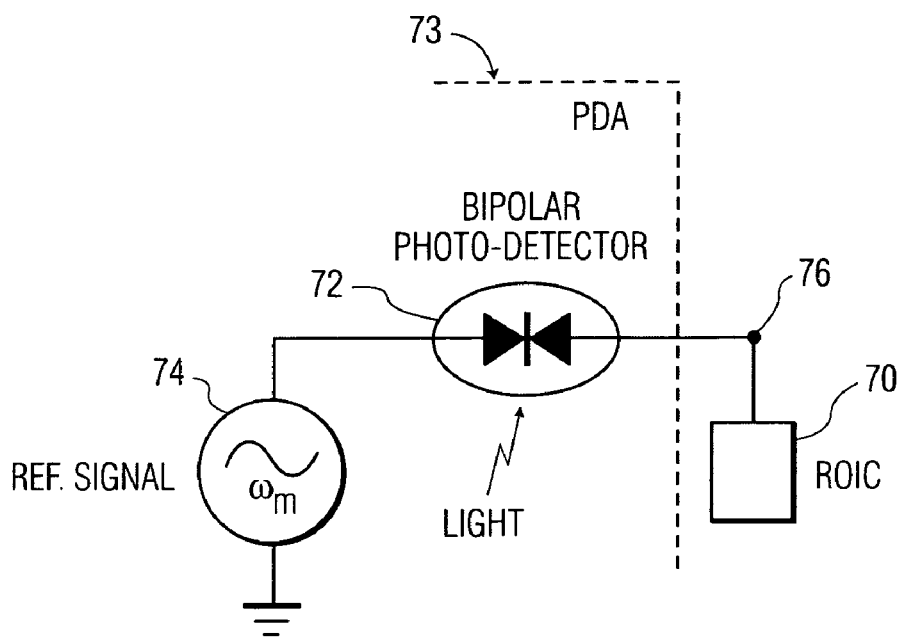
FIG. 7 is a schematic block diagram of a PDA coupled to a ROIC, including an array of bipolar photo-detectors (only one shown) in the PDA for providing synchronous detection of sensed light intensity impinging on each photo-detector, in accordance with an embodiment of the invention.

Yet another embodiment of the invention is shown in FIG. 7. This embodiment is a preferred one, because it is the easiest to fabricate. As shown, PDA 73 includes an array of bipolar photo-detectors 72 (only one is shown). The output of each bipolar photo-detector 72 is connected to a respective unit cell (not shown) of ROIC 70.

Figure 8:
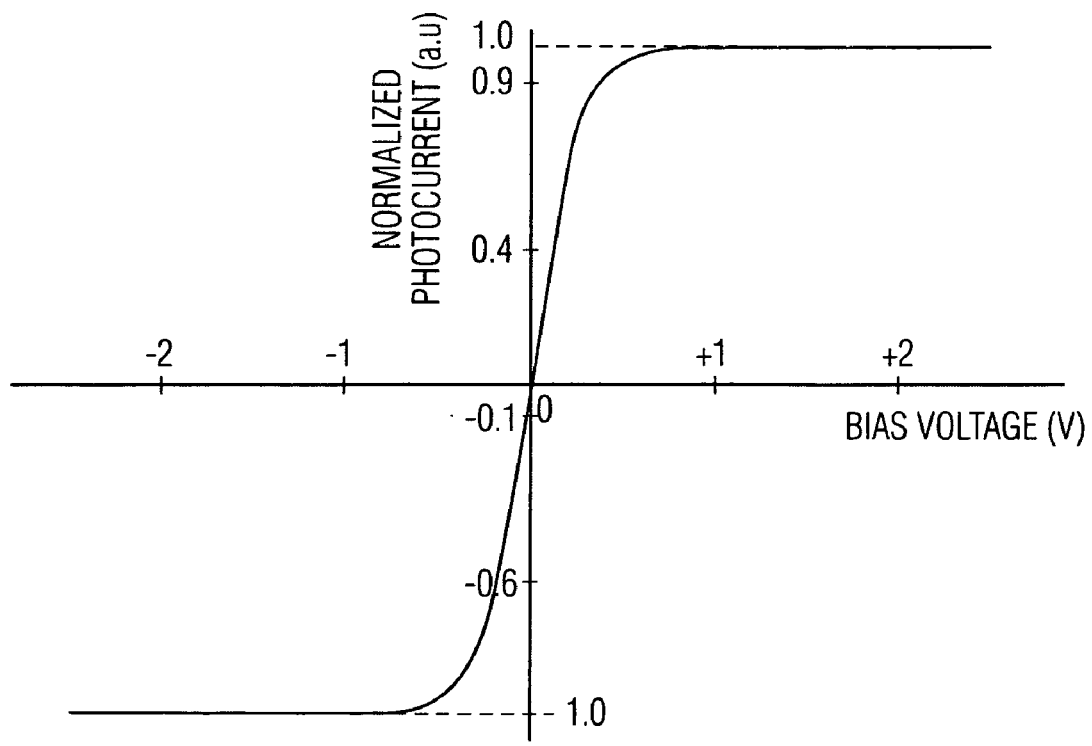
FIG. 8 is a response characteristic curve showing current versus bias voltage for the bipolar photo-detector of FIG. 7.

A response characteristic (current-versus-voltage) of bipolar photo-detector 72 is shown in FIG. 8. This is a desired response characteristic for synchronous detection, when the bias voltage (V) is derived from reference signal generator 74. As will be appreciated, when the reference signal $\omega_m$ (which may be binary or sinusoidal) provides a bias voltage of +1.0 volt (for example, as shown in FIG. 8) to bipolar photo-detector 72, the output current at node 76 is +1.0 a.u. (normalized value); and when the reference signal provides a bias voltage of −1.0 volt (for example), the output current at node 76 is −1.0 a.u. (normalized value). It will also be appreciated that when the bias voltage is positive, the bipolar photo-detector is forward-biased and provides a current output (1.0 a.u.) proportional to the light intensity impinging on the photo-detector. When the bias voltage is negative, however, the bipolar photo-detector is reverse-biased and provides no output current due to the light impinging on the photo-detector.

Figure 9:
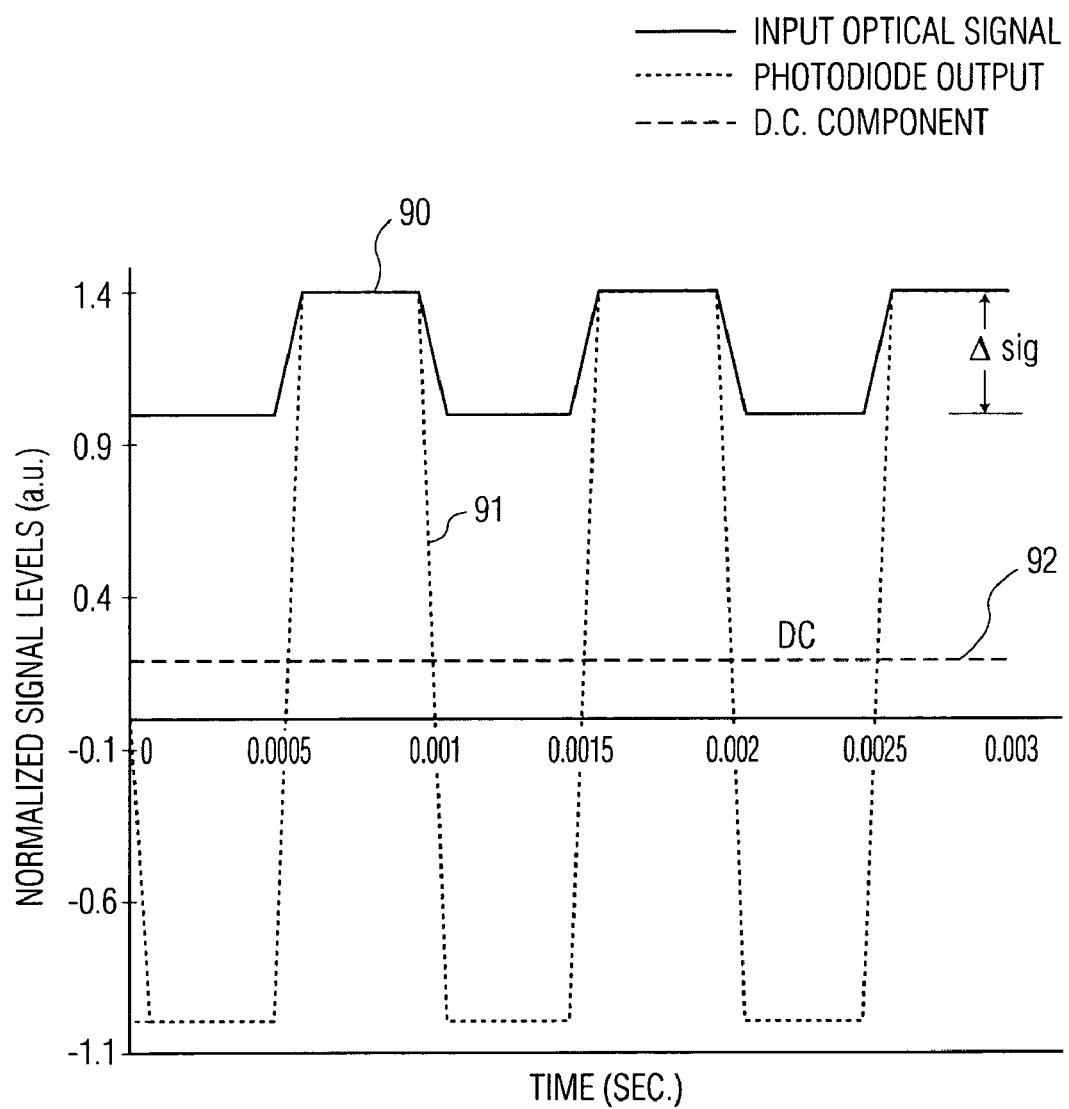
FIG. 9 depicts a representation of various signal amplitudes versus time for illustrating a synchronous detection process of the circuit of FIG. 7 in the time domain, in accordance with an embodiment of the invention.

FIG. 9 illustrates the synchronous detection of bipolar photo-detector 72. As shown, the input optical signal (solid lines 90) includes the background noise and the modulated signal amplitude (Δsig), similar to Ysig(t) shown in FIG. 5A. The reference signal ($\omega_m$) biasing the bipolar photo-detector, for purpose of discussion, is a 1 kHz signal (1 msec period) and may be similar to the reference signal shown in FIG. 5E. Due to the bias voltage derived from the reference signal and the response characteristic of the bipolar photo-detector, the output signal, formed at node 76, may be as shown by dotted lines 91 in FIG. 9, and may be similar to the output signal shown in FIG. 5D. When the photo-detector is forward biased by the reference signal, the output current is 1.4 a.u. (normalized value) and when the photo-detector is reverse biased, the output current is −1.0 a.u. (normalized value).

After passing the photodiode output signal (dotted lines 91) through a low pass filter (not shown), the DC component of the signal of interest (Δsig) is formed, as shown by dashed line 92. It will be appreciated that the low pass filter may be similar to integration capacitor 47 shown in FIGS. 4 and 6 and may be formed within each unit cell of ROIC 70. As such, node 76 of FIG. 7 may be the same as sense node 50 of FIGS. 4 and 6.

The embodiment of FIG. 7 may be directly interfaced with any conventional ROIC unit cell, without requiring any modification to the ROIC, and provides a PDA that implements synchronous detection. This embodiment is preferred over the embodiments shown in FIGS. 4 and 6, therefore, since only bipolar photo-detectors having the bipolar transfer function of FIG. 8 are required.

There is a need, in the implementation of the bipolar photo-detector as a synchronous detector, to avoid coupling of noise from the reference signal through the capacitance of the detector, as there may be an AC bias on the photo-detector itself. Again, this signal may be relatively low due to the low speed of the biasing signal (for example 1 kHz).

Conventional photo-detectors, such as pn junction photodiodes, Schottky barrier photo-diodes, and PIN photo-diodes, do not exhibit the current-voltage characteristic of FIG. 8. However, metal-semiconductor-metal (MSM) photodiodes (which also have very low capacitance per unit area) exhibit this form of optical response and may be used as bipolar photo-detectors for the embodiment shown in FIG. 7.

Another option for a bipolar photo-detector may be the use of pnp or npn junction devices. These junction devices have the current-voltage characteristic of FIG. 8 and do not have problems typically associated with MSM photodiodes (high dark current, surface state sensitivity and sub-optimal quantum efficiency). In addition, these junction devices may be readily interfaced with ROIC devices, because they have a vertical structure.

Figure 10:
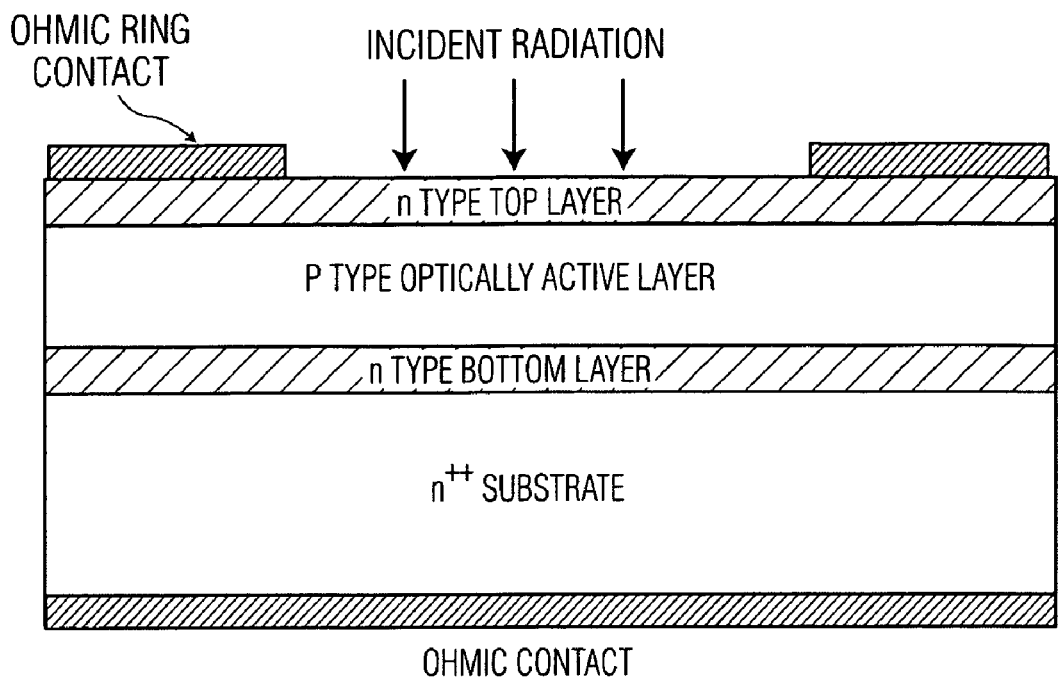
FIG. 10 is a schematic illustration of a photo-detector structure that may be used in the circuit of FIG. 7 to provide the response characteristic curve of FIG. 8.
Figure 11:
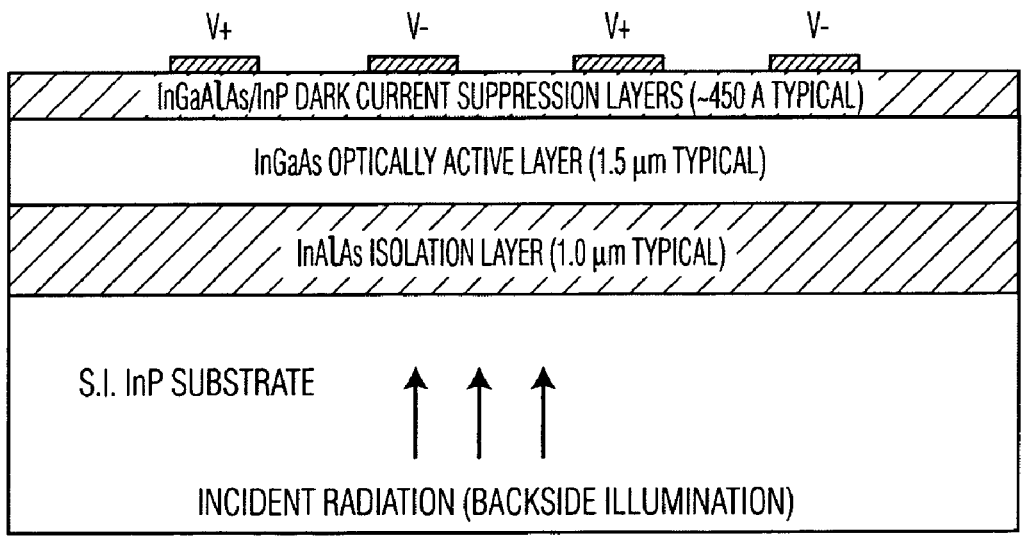
FIG. 11 is a schematic illustration of another photo-detector structure that may be used in the circuit of FIG. 7 to provide the response characteristic curve of FIG. 8.

FIG. 10 illustrates an npn photo-detector structure that has bipolar photo-current characteristics. FIG. 11 shows an indium-gallium-arsenide (InGaAs) MSM photo-detector structure that also has bipolar photo-current characteristics. In both structures, the forward and reverse illuminated current-voltage characteristics must be tightly matched. It is quite possible, however, that matching the forward and reverse bias optical response for these structures may be easier than making two different elements match each other, as is required in the other embodiments (FIGS. 4 and 6).

The npn photo-detector structure shown in FIG. 10 may be easier to integrate with a ROIC than the MSM structure shown in FIG. 11. The npn photo-detector structure of FIG. 10 includes an attachment point (ohmic ring contact) at the top and bottom of the structure, as shown, whereas the MSM structure of FIG. 11 includes attachment points ($V^+$ and $V^-$) at the top only.

The embodiments of the invention shown in FIGS. 4, 6 and 7 provide synchronous detection within a unit cell of a ROIC/PDA. Whereas the embodiments shown in FIGS. 4 and 6 require modification of existing ROICs, the embodiment shown in FIG. 7 does not require modification of existing ROICs. Only customization of photo-detectors may be required in the embodiment of FIG. 7 (bipolar photo-detector).

Synchronous detection is of value in a transmitter/receiver which receives and extracts a repetitive signal from a noisy background. A laser source may be modulated in the transmitter to provide this repetitive signal. The received signal may be separated from the background noise, because it has temporal frequency and phase relationships with the transmitted modulated laser source signal. In accordance with the embodiments of the invention, synchronous detection is independently implemented for each pixel of a PDA. This advantageously allows for both staring operation and synchronous detection.

An active sensor having a PDA using the embodiments of this invention may advantageously result in an active sensor that is smaller, simpler, more integrated, rugged, reliable, and capable of delivering higher frame rates using less power than anything available conventionally. In addition, other active sensors, such as Terahertz (THz) imaging, may use PDA based implementations of synchronous detection in accordance with the described embodiments of the invention.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A synchronous detector for a unit cell of a read out integrated circuit (ROIC) comprising
   a bipolar photo-detector formed in a photo detector array (PDA) for sensing light energy, the bipolar photo-detector having one end coupled to a sense node of the unit cell, and
   a reference generator coupled to another end of the bipolar photo-detector for biasing the bipolar photo-detector,
   wherein the bipolar photo-detector is biased by the reference generator and the light energy sensed by the bipolar photo-detector is provided to the sense node as a synchronously detected signal.

2. The synchronous detector of claim 1 further including
   a capacitor coupled to the sense node for low pass filtering the synchronously detected signal.

3. The synchronous detector of claim 1 wherein the reference generator provides alternating positive and negative voltage levels, the positive voltage level forward biasing the bipolar photo-detector and the negative voltage level reverse biasing the bipolar photo-detector.

4. The synchronous detector of claim 3 wherein the light energy sensed by the bipolar photo-detector is a modulated laser light signal, in phase with the alternating positive and negative voltage levels provided by the reference generator, and
   the bipolar photo-detector provides alternating positive and negative current levels to the sense node, in response to the modulated laser light signal.

5. The synchronous detector of claim 1 wherein the bipolar photo-detector is one of a npn-photo-detector and a metal-semiconductor-metal (MSM) photo-detector.

6. A photo detector array (PDA) coupled to a read out integrated circuit (ROIC), the PDA comprising
   a plurality of bipolar photo-detectors arranged in an array, each sensing light energy and each having one respective end coupled to a corresponding sense node of a unit cell in the ROIC, and
   a reference generator coupled to another end of each respective bipolar photo-detector for biasing the respective bipolar photo-detector,
   wherein the respective bipolar photo-detector is biased by the reference generator and the light energy sensed by the respective bipolar photo-detector is provided to the corresponding sense node as a synchronously detected signal.

7. The PDA of claim 6 further including
   a plurality of capacitors, each capacitor coupled to the corresponding sense node in the ROIC for low pass filtering the synchronously detected signal.

8. A method of synchronously detecting light energy comprising the steps of:
   (a) modulating a laser light signal using a modulation signal;
   (b) transmitting the modulated laser light signal toward a target;

(c) receiving, in each pixel of a photo detector array (PDA) where each pixel is a bipolar photo-detector, a return signal based on the transmitted laser light signal;

(d) biasing each pixel of the PDA using the modulation signal;

(e) detecting sequentially, in each pixel of the PDA, positive and negative signal levels of the return signal in response to the biasing in step (d); and (f) forming a frame of an image based on the transmitted laser light signal;

wherein step (d) includes forward and reverse biasing the bipolar photo-detector using the modulation signal.

9. The method of claim 8 in which step (e) includes outputting, onto a sense node of a read out integrated circuit (ROIC), the positive and negative signal levels of the return signal, in response to the forward and reverse biasing of the bipolar photo-detector.

10. The method of claim 9 including the following step:

(g) low pass filtering, at the sense node, the positive and negative signal levels of the return signal.

11. A synchronous detector for a unit cell of a read out integrated circuit (ROIC) comprising a bipolar photo-detector formed in a photo detector array (PDA) for sensing light energy, the bipolar photo-detector having one end coupled to a sense node of the unit cell, and a reference generator coupled to another end of the bipolar photo-detector for biasing the bipolar photo-detector, wherein the bipolar photo-detector is biased by the reference generator and the light energy sensed by the bipolar photo-detector is provided to the sense node as a synchronously detected signal, the reference generator provides alternating positive and negative voltage levels, the positive voltage level forward biasing the bipolar photo-detector and the negative voltage level reverse biasing the bipolar photo-detector, the light energy sensed by the bipolar photo-detector is a modulated laser light signal, in phase with the alternating positive and negative voltage levels provided by the reference generator, and the bipolar photo-detector provides alternating positive and negative current levels to the sense node, in response to the modulated laser light signal.

12. The synchronous detector of claim 11 wherein the bipolar photo-detector is one of a npn-photo-detector and a metal-semiconductor-metal (MSM) photo-detector.

13. The synchronous detector of claim 11 further including a capacitor coupled to the sense node for low pass filtering the synchronously detected signal.

* * * * *